United States Patent
Cafaro et al.

(10) Patent No.: US 6,959,397 B2
(45) Date of Patent: Oct. 25, 2005

(54) PROGRAMMABLE SKEW CLOCK SIGNAL GENERATOR SELECTING ONE OF A PLURALITY OF DELAYED REFERENCE CLOCK SIGNALS IN RESPONSE TO A PHASE ACCUMULATOR OUTPUT

(75) Inventors: Nicholas Giovanni Cafaro, Coconut Creek, FL (US); Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 196 days.

(21) Appl. No.: 10/464,239

(22) Filed: Jun. 18, 2003

(65) Prior Publication Data

US 2004/0257130 A1 Dec. 23, 2004

(51) Int. Cl.[7] ................................................. G06F 1/04
(52) U.S. Cl. ....................... 713/503; 713/401; 713/500; 375/371
(58) Field of Search ................................ 713/400, 401, 713/500, 501, 502, 503; 375/371

(56) References Cited

U.S. PATENT DOCUMENTS

| | | | |
|---|---|---|---|
| 6,320,436 B1 | | 11/2001 | Fawcett et al. |
| 6,353,649 B1 | * | 3/2002 | Bockleman et al. ........ 375/376 |
| 6,614,813 B1 | * | 9/2003 | Dudley et al. .............. 370/532 |
| 6,768,442 B2 | * | 7/2004 | Meyers et al. .............. 341/158 |
| 2003/0152181 A1 | * | 8/2003 | Stengel et al. .............. 375/371 |

OTHER PUBLICATIONS

Uyemura John P, CMOS Logic Circuit Design, 2002, Kluwer Academic Publishers, pp. 271–273.*

Cypress Semiconductor Corporation, "RoboClock® CY7B9950: 2.5/3.3V, 200-MHz High-Speed Multi-Phase PLL Clock Buffer," Document #: 38-07338 Rev. *B, Mar. 4, 2003, Cypress Semiconductor Corporation, 3901 North First Street, San Jose, CA 95134.

Liu, Shen-Iuan, et al. "Low-Power Clock-Deskew Buffer for High-Speed Digital Circuits," IEEE Journal of Solid-State Circuits, Apr. 1999, pp. 554–558, vol. 34, No. 4, Publisher Item Identifier S 0018-9200(99)02436-1.

* cited by examiner

*Primary Examiner*—Thomas Lee
*Assistant Examiner*—Mark Connolly (57) ABSTRACT

A programmable skew clock signal generator has a frequency generator circuit (104) consistent with the invention produces an output signal $F_{\phi 0}$ from a reference signal $F_{ref}$. A frequency accumulator (132, 152) is preloaded with a pre-load value $P_{K1}$ and receives one reference signal cycle as a clock signal, receives a constant $K_1$ as an input thereto, with the frequency accumulator (132, 152) having a maximum count $K_{MAX}$ and producing an overflow output. A phase accumulator (136, 156) is preloaded with a preload value $P_{C1}$ and receives one overflow cycle output from the frequency accumulator (132, 152) as a clock signal and receives a phase offset constant $C_1$ as an input thereto. The phase accumulator (136, 156) has a maximum count $C_{MAX}$ and produces a phase accumulator (136, 156) output. A delay line (320) is clocked by the reference signal $F_{ref}$ and produces a plurality of delayed reference clock signals at a plurality of tap outputs. A tap selecting circuit (140, 144; 160, 164) receives the phase accumulator output and selects at least one of the tap outputs in response thereto to produce an output $F_{\phi 1}$ whose phase shift $\phi_1$ relative to $F_{0\phi}$ is a function of $P_{K1}$ and $P_{C1}$.

25 Claims, 5 Drawing Sheets

PROGRAMMABLE SKEW CLOCK SIGNAL GENERATOR SELECTING ONE OF A PLURALITY OF DELAYED REFERENCE CLOCK SIGNALS IN RESPONSE TO A PHASE ACCUMULATOR OUTPUT

FIELD OF THE INVENTION

This invention relates generally to the field of skew correction of clock signals. More particularly, in accordance with certain embodiments consistent with the present invention, this invention relates to a clock de-skewing arrangement that utilizes a delay line architecture.

BACKGROUND OF THE INVENTION

Clock skew problems can manifest themselves in several environments, including but not limited to, chip-level, System-on-Chip (SoC), and board/system level. As an example of chip-level skew, consider a microprocessor whose synchronous circuitry (i.e. flip-flops) is spread across a wide area of an integrated circuit chip. Now consider a single clock signal that is to be distributed across the chip in such a way that the rising edge of each clock cycle reaches each flip-flop at the same point in time. Skew in this environment is becoming a more problematic issue as device sizes shrink, clock speeds increase, and chip size increase. This means that the path delay in a signal trace may differ by many cycles of a clock period from one section of the chip to another. With system clock frequencies well into the gigahertz range, clock skews on the order of picoseconds can produce adverse affects on system performance, or even disrupt system functionality.

A similar problem arises in so-called "System-on-Chip" scenarios. A clock signal should be routed to a baseband section, a microprocessor, and a memory block (or other functional blocks) with minimal skew. Again, the length of an on-chip signal path from the clock generator to the various functional blocks can be long enough to introduce significant delay and thereby affect the maximum operating frequency. Skew can also be a problem on a board level system for the same reasons outlined above. But on a board level system, the problem can be even further exacerbated by even longer signal traces and more severe loading caused by signal paths that are routed on and off chips and other components.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

This invention, in certain embodiments consistent therewith, provides a flexible, integrated solution whereby a clock de-skew operation is performed within the clock generation function. Due to the inherent nature of the clock generation, the adjustable phase resolution of the output signal(s) can be made very fine as will be demonstrated below.

Figure 1:
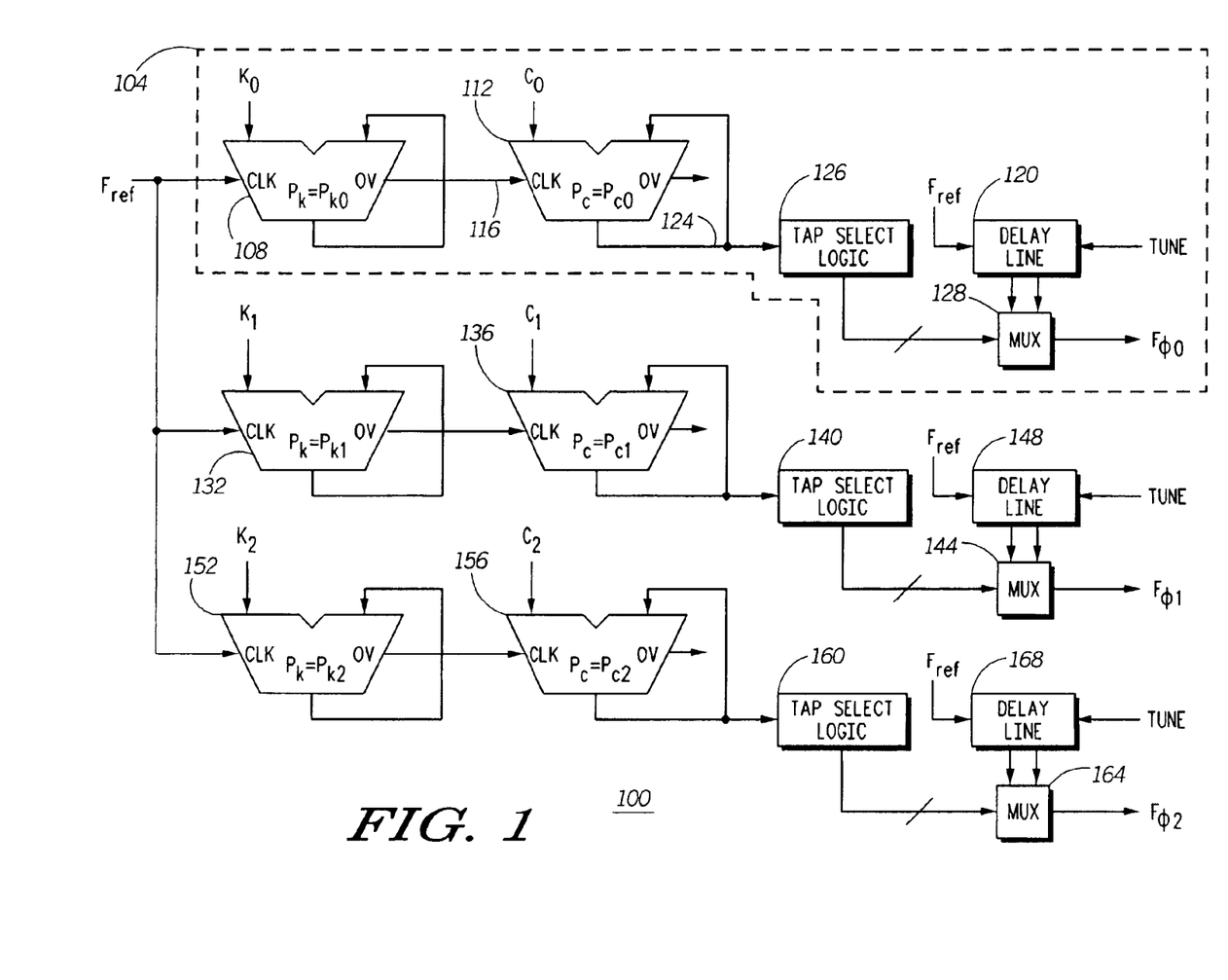
FIG. 1 is a schematic diagram of a programmable skew clock circuit consistent with certain embodiments of the present invention.

With reference to the exemplary architecture of a programmable skew clock generator circuit shown in FIG. 1, circuit 100 thereof can be used to generate three independently programmable output signals $F_{\phi 0}$, $F_{\phi 1}$ and $F_{\phi 2}$, where $F_{\phi 1}$ and $F_{\phi 2}$ may be phase-shifted relative to $F_{\phi 0}$. The outputs $F_{\phi 0}$, $F_{\phi 1}$ and $F_{\phi 2}$ can be described as functions of time (t), period (T), and phase shift ($\phi$). While the frequencies of the output signals are shown to be independent here for the sake of generality, it should be noted that many or perhaps most de-skew mechanisms would attempt to align signals of equal frequency, i.e. $T\phi 1 = T\phi 2 = T\phi 3$. Let us first review how an output signal is generated without any de-skew using the uppermost signal generator circuitry 104, shown in broken lines.

Accumulator 108 is referred to herein as a "frequency accumulator" 108 and the accumulator 112 is referred to herein as a "phase accumulator" 112. The frequency accumulator 108 is clocked by a reference clock with frequency $F_{ref}$, and operates according to an input value $K_0$ which serves as a frequency division constant that is loaded into the accumulator. The value of $K_0$ is determined by the desired output frequency $F_{out}$ according to the relationship:

$$\frac{K_0}{K_{MAX}} = \frac{F_{OUT}}{F_{ref}}, \qquad \text{Eqn. 1}$$

where, $K_{MAX}$ is the maximum count of the frequency accumulator 108.

The phase accumulator 112 is clocked by an overflow signal 116 from the frequency accumulator 108 and operates according to an input value $C_0$ which serves as a phase offset constant. The overflow signal 116 of frequency accumulator 116 provides a signal that is an average $F_{\phi 0}$. The value of $C_0$ is also a function of the desired output frequency and is given by:

$$C_0 = \text{Frac}\left(\frac{K_{MAX}}{K_0}\right) \cdot C_{MAX} = \text{Frac}\left(\frac{F_{ref}}{F_{out}}\right) \cdot C_{MAX}, \qquad \text{Eqn. 2}$$

where $C_{MAX}$ is the maximum count of the phase accumulator 112 and in this case Fout is equal to $F_{\phi 0}$.

If a switching event is defined as a transition in the output signal from high to low or low to high, then one can view the frequency accumulator 108 as controlling the average frequency at which a switching event occurs. Meanwhile the phase accumulator 112 determines the phase of the transition relative to $F_{ref}$ by selecting the appropriate tap from tapped delay line 120. This is accomplished by providing the output 124 from phase accumulator 112 to a tap selection logic circuit 126 that controls a multiplexer 128. Tapped delay line 120 receives the input reference clock $F_{ref}$ and produces a sequence of delayed versions of $F_{ref}$ at a sequence of output taps in a known manner.

Tap selection logic circuit 126 determines which of the plurality of taps from delay line 120 should be selected to produce the desired output signal. The tap selection logic circuit 126 translates the contents of the phase accumulator 112 to a binary coded (or analogous) tap address. Multiplexer 128 receives the tap address from the tap selection logic circuit 126 that determines which tap of delay line 120 is passed to the output to produce $F_{\phi 0}$. The coarseness or fineness of the output frequency resolution is dependent upon the capacity of phase accumulator 112. The higher the capacity of the phase accumulator 112, the more resolution that is obtainable at the output.

The delay line 120 may have minor errors from delay element to delay element and across the delay line. Accordingly, the delay line may be locked in a delay locked loop and/or may incorporate any suitable mechanism to individually tune the delay of one or more of the delay elements forming a part thereof (shown as a "tune" input to the delay line).

The number of delay elements in the delay line 120 will determine the quantization error associated with placing an output edge at a precise moment in time. This quantization error will result in phase jitter on the output signal. Therefore, by use of the frequency accumulator 108 and phase accumulator 112 and other circuitry 100 as shown, one can generate any desired output value of frequency up to $F_{ref}$ within the resolution of the circuitry. The output frequency $F_{\Phi 0}$ can therefore be defined (within the resolution of the circuit) by the equation:

$$F_{\phi 0} = F_{ref} \div \left[\text{Integer}\left(\frac{K_{MAX}}{K_0}\right) + \text{fract}\left(\frac{C_0}{C_{MAX}}\right)\right] = F_{ref} \cdot \frac{K_0}{K_{MAX}}. \qquad \text{Eqn. 3}$$

The above definition of a switching event can be used to see how altering the contents of each of accumulators 108 and 112 can be used to control the phase of the output signal. If the frequency accumulator 108 is forced to begin the accumulation process from some number other than zero by preloading it (e.g., at the time of a circuit reset), then the amount of time it takes for an overflow of accumulator 108 to occur can be decreased. This results in a switching event occurring during an earlier reference clock cycle than would be the case if the accumulator 108 had started counting from zero. Since the operation of the phase accumulator 112 is dependent on the frequency accumulator 108's overflow, a similar adjustment is provided there as well.

In order to add any desired time skew to the output, the frequency accumulator can be preloaded with a frequency accumulator preload value given by:

$$P_K = \frac{\phi}{2\pi} \cdot K_{MAX}, \qquad \text{Eqn. 4}$$

where $\phi$ is the desired phase shift in radians. The phase accumulator preload value for the same phase shift is then given by:

$$P_C = \left[K_{MAX} - \text{Frac}\left(\frac{P_K}{K}\right)\right] \cdot C_{MAX} \qquad \text{Eqn. 5}$$

The output of multiplexer 128 is given by the following equation:

$$x(t) = \text{rect}\left(\frac{t}{T_p}\right) = \begin{cases} 1 & \text{for } |t| < \frac{T_p}{2} \\ 0 & \text{otherwise,} \end{cases} \qquad \text{Eqn. 6}$$

$$F_{\phi 0}(t) = \sum_{n=0}^{\infty} x(t - nT_{\phi 0}) \qquad \text{Eqn. 7}$$

where $T_p$ is the pulse width, $T_{\phi 0}$ is the period and rect is a rectangular function as defined in Equation 6. If preload values $P_K$ and $P_C$ are set to zero for circuit 104, as illustrated in this exemplary embodiment, then there will be zero phase adjustment to the output.

Thus, a reference generator circuit 104 consistent with certain embodiments of the invention has a reference frequency accumulator 108, preloaded with a preload value $P_{K0}$ and receives one cycle of the reference clock signal, followed by constant $K_0$ as the accumulator input thereafter during subsequent clock cycles. The frequency accumulator has a maximum count $K_{MAX}$ and produces an overflow output when the maximum count is reached. A reference phase accumulator 112 is preloaded with a preload value $P_{C0}$ and receives one overflow output from the frequency accumulator as a clock signal. It then receives a phase offset constant $C_0$ as an input thereto, with the phase accumulator having a maximum count $C_{MAX}$ and producing a phase accumulator overflow output. A reference delay line 120 is clocked by the reference input signal and produces a plurality of delayed reference clock signals at a plurality of tap outputs. A reference tap selecting circuit receives the phase accumulator output and selects at least one of the tap outputs in response thereto to produce an output $F_{\phi 0}$.

For the reference generator 104, the preload values may be zero. Other similar circuits can be used to produce clock outputs that are skewed with reference thereto as will be described below. By use of the accumulator preload values of equations 4 and 5, any number of phase adjusted outputs can be created by duplication of the circuit arrangement of FIG. 1. Two such duplicates are shown in FIG. 1 by way of example to produce $F_{\phi 1}$ and $F_{\phi 2}$, but any number of such networks can be devised as desired. The first duplicate receives input $K_1$ at frequency accumulator 132 and $C_1$ at phase accumulator 136 to determine the output frequency. The output of phase accumulator 136 drives tap select logic 140 which controls multiplexer 144 to select one or more delay line taps from delay line 148 to produce output signal $F_{\Phi 1}$. The phase can be offset in time from $F_0$ by delay $\phi_1$, which is determined by the preload values $P_{K1}$ and $P_{C1}$.

Thus, $P_{K1}$ and $P_{C1}$ are determined by equations 4 and 5 to obtain the desired time skew delay (phase shift) $\phi_1$ and are effective in altering the starting point of the accumulation value. That is, the preload values are loaded at the time of a circuit reset and are added during the initial clock cycle for each accumulator and serve to skew where the first overflow takes place. The input values are then added in during subsequent clock cycles.

The second duplicate receives input $K_2$ at frequency accumulator 152 and $C_2$ at phase accumulator 156 to determine the output frequency. The delay $\phi_2$ is determined by $P_{K2}$ and $P_{C2}$, again by application of equations 4 and 5 above. The output of phase accumulator 156 drives tap select logic 160 which controls multiplexer 164 to select one or more delay line taps from delay line 168 to produce output signal $F_{\Phi2}$ which is offset in time from $F_{\phi0}$ by delay $\phi_2$.

For the two phase shifted outputs $F_{\phi1}$ and $F_{\phi2}$, the values of $P_{K1}$, $P_{C1}$, $P_{K2}$ and $P_{C2}$ are given by:

$$P_{K1} = \frac{\phi_1}{2\pi} \cdot K_{MAX}, \quad \text{Eqn. 8}$$

$$P_{C1} = \left[K_{MAX} - \text{Frac}\left(\frac{P_{K1}}{K_1}\right)\right] \cdot C_{MAX}, \quad \text{Eqn. 9}$$

$$P_{K2} = \frac{\phi_2}{2\pi} \cdot K_{MAX}, \quad \text{and} \quad \text{Eqn. 10}$$

$$P_{C2} = \left[K_{MAX} - \text{Frac}\left(\frac{P_{K2}}{K_2}\right)\right] \cdot C_{MAX}. \quad \text{Eqn. 11}$$

By analogy to the output equations 6 and 7 above, the output of multiplexers 144 and 164 are respectively given by:

$$F_{\phi1} = \sum_{n=0}^{\infty} x[t - nT_{\phi1} - \phi_1] \quad \text{and} \quad \text{Eqn. 12}$$

$$F_{\phi2} = \sum_{n=0}^{\infty} x[t - nT_{\phi2} - \phi_2], \quad \text{Eqn. 13}$$

where $\phi_1$ and $\phi_2$ represent the time delay measured from the reference signal $F_{\phi0}$. So, in general, the output of any of the clock circuits is given by:

$$F_\phi = \sum_{n=0}^{\infty} x[t - nT - \phi]. \quad \text{Eqn. 14}$$

Thus, in accordance with certain embodiments consistent with the present invention, a programmable skew clock signal generator has a frequency generator circuit that produces an output signal $F_{\phi0}$ from a reference signal $F_{ref}$. A frequency accumulator is preloaded with a preload value $P_{K1}$ and receives the reference signal as a clock signal, receives a frequency division constant $K_1$ as an input thereto, with the frequency accumulator having a maximum count $K_{MAX}$ and producing an overflow output. A phase accumulator is preloaded with a preload value $P_{C1}$ and receives the overflow output from the frequency accumulator as a clock signal and receives a phase offset constant $C_1$ as an input thereto. The phase accumulator has a maximum count $C_{MAX}$ and produces a phase accumulator output. A delay line is clocked by the reference signal $F_{ref}$ and produces a plurality of delayed reference clock signals at a plurality of tap outputs. A tap selecting circuit receives the phase accumulator output and selects at least one of the tap outputs in response thereto to produce an output $F_{\phi1}$ whose phase shift $\phi_1$ relative to $F_0$ is a function of $P_{K1}$ and $P_{C1}$.

Figure 2:
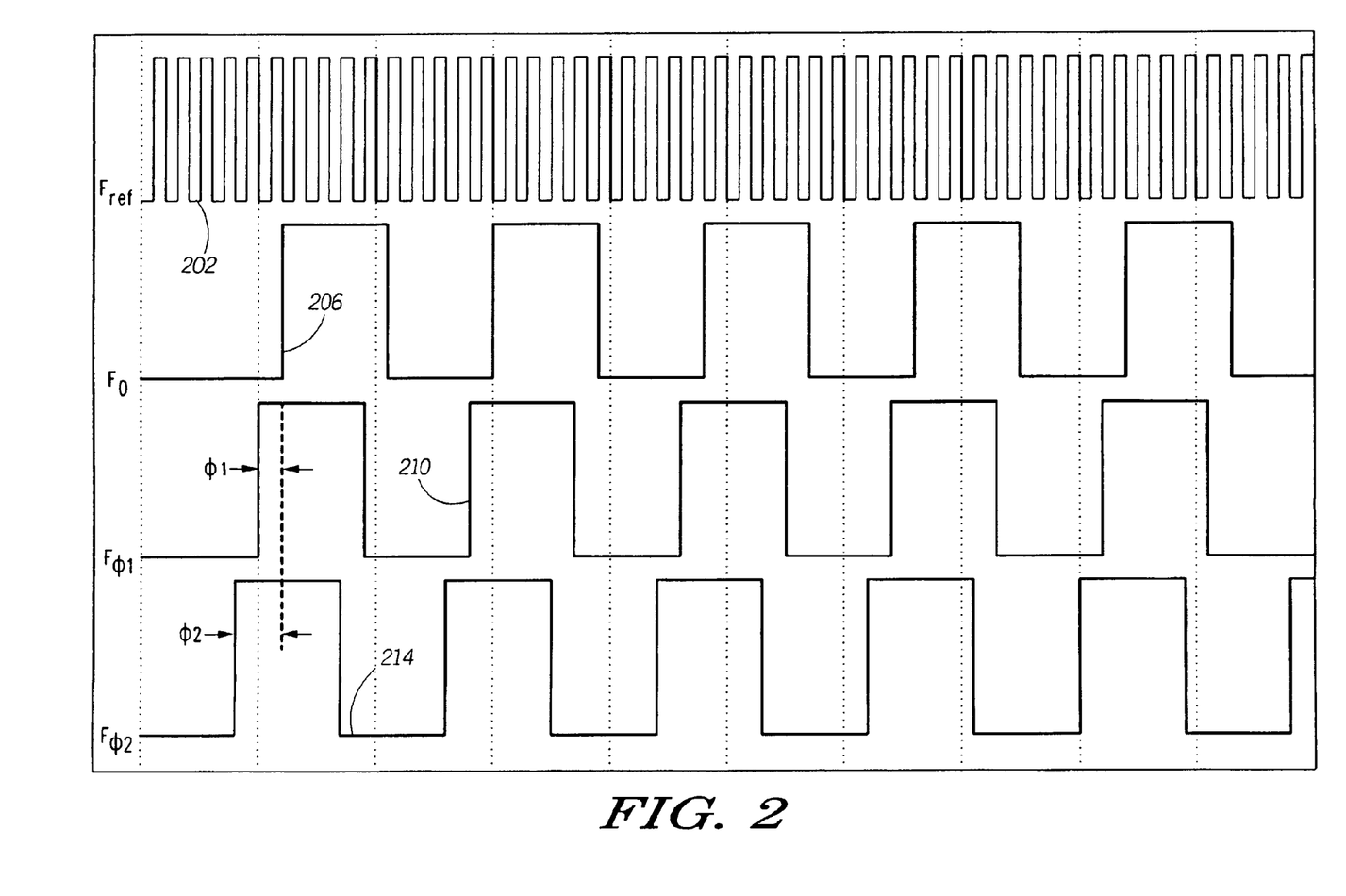
FIG. 2 is a graph depicting exemplary programmed output signals from circuit 100 as they relate to a reference clock input signal and to each other, consistent with certain embodiments of the present invention.

The results of a simulation of system 100 generating three independent outputs are shown in FIG. 2. The top waveform 202 is a 500 MHz reference clock $F_{ref}$. The second waveform 206 represents a 55 MHz output that has no skew adjustment applied to it—i.e., accumulator 112 is preloaded with zero as $C_C$. The third waveform 210 is phase shifted by $\phi_1 = \pi/8$ relative to the first output signal. The last signal 214 is phase shifted by $\phi_2 = \pi/4$ relative to the first output signal.

Figure 3:
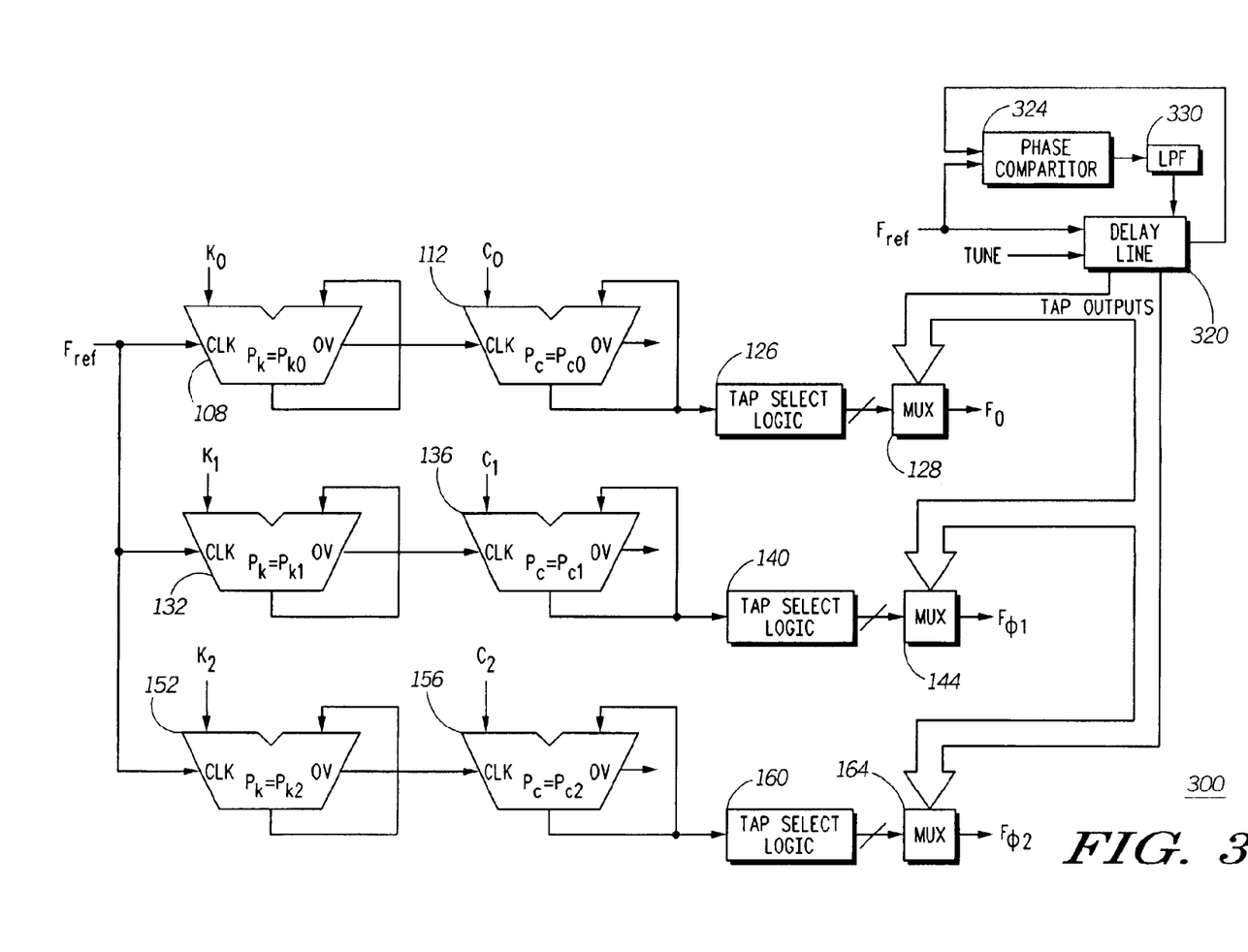
FIG. 3 is a block diagram of an alternative programmable skew clock circuit consistent with certain embodiments of the present invention.

Referring now to FIG. 3, a variation in the circuit of FIG. 1 is depicted as clock generator circuit 300. In this variation, the frequency accumulators 108, 132 and 152, the phase accumulators 112, 136 and 156, the tap selection logic circuits 126, 140 and 160, and the multiplexers 128, 144 and 164 operate in a substantially identical manner as in circuit 100. Delay lines 120, 148 and 168, however, are replaced by a single tapped delay line 320. Delay line 320 may operate in an identical manner as any of individual delay lines 120, 148 and 168, with the possible exception of being able to drive a greater load since each output tap may be used to provide any of the three output signals (and in general, any desired number of output signals).

In addition, the accuracy of the delay line 320's individual delays can be enhanced by locking the delay line to the reference clock $F_{ref}$ in a delay locked loop, and further by any suitable tuning mechanism (shown as a "tune" input that equalizes the delays of the individual delay elements). In the exemplary delay locked loop depicted, the input reference clock $F_{ref}$ is compared in a phase comparator circuit 324 with a delayed version of the reference clock. This produces an output that is low pass filtered at filter 330 to produce a correction signal that is used to correct the overall delay of the delay line 320. If each delay element in the delay line is approximately equal, locking the delay line in the delay locked loop will bring the individual delays close to a desired value to accurately generate the output signals from the multiplexers. In other variations, one or more sets of phase detectors and low pass filters can be used to provide correction to the individual delay elements to further enhance the accuracy and consistency of the delay elements. Accordingly, many variations of the invention will occur to those skilled in the art upon consideration of the present teaching.

Figure 4:
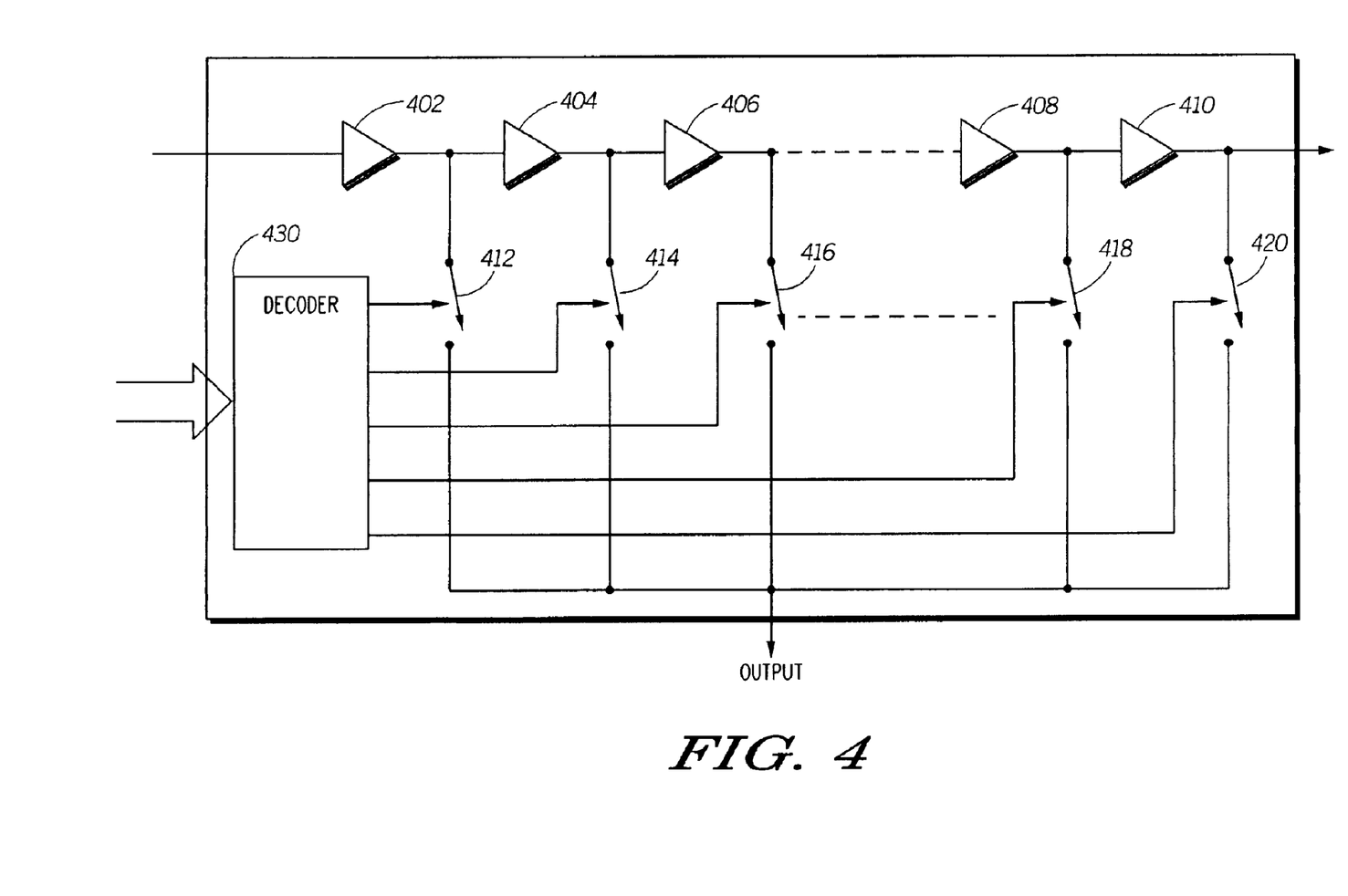
FIG. 4 is a schematic block diagram of an alternative delay line integrated circuit consistent with certain embodiments of the present invention.

In another variation of the present invention, the multiplexer (e.g., multiplexer 128) can be integrated into the delay line circuit itself. This is illustrated in FIG. 4 in which a delay line circuit is shown utilizing a plurality of transmission gates that form switches to accomplish the multiplexing function. In this embodiment, only one multiplexer is integrated with the delay line, but those skilled in the art will understand that multiple similar sets of switches can be used to take the place of multiple multiplexers as desired. In this variation, the delay line is made up of a plurality of delay elements 402, 404, 406, ..., 408 and 410 are physically or logically coupled in series as shown to produce a sequence of delayed outputs at the output of each delay element in a known manner. Each output (and possibly, although not shown, the input of the first delay element) is coupled to a transmission gate switch (shown schematically herein as switches) that may be fabricated from one or more FETs or other suitable active or passive switching element.

Thus, transmission gate switches 412, 414, 416, ..., 418 and 420 are coupled to the outputs of the plurality of delay elements 402, 404, 406, ..., 408 and 410. Each of the transmission gate switches is controlled by a control signal that either effectively open circuits or short circuits the switch. These control signals may be individually brought out of the integrated circuit, or they may be processed by a decoder circuit 430 to reduce the number of input/output lines associated with the integrated circuit.

Figure 5:
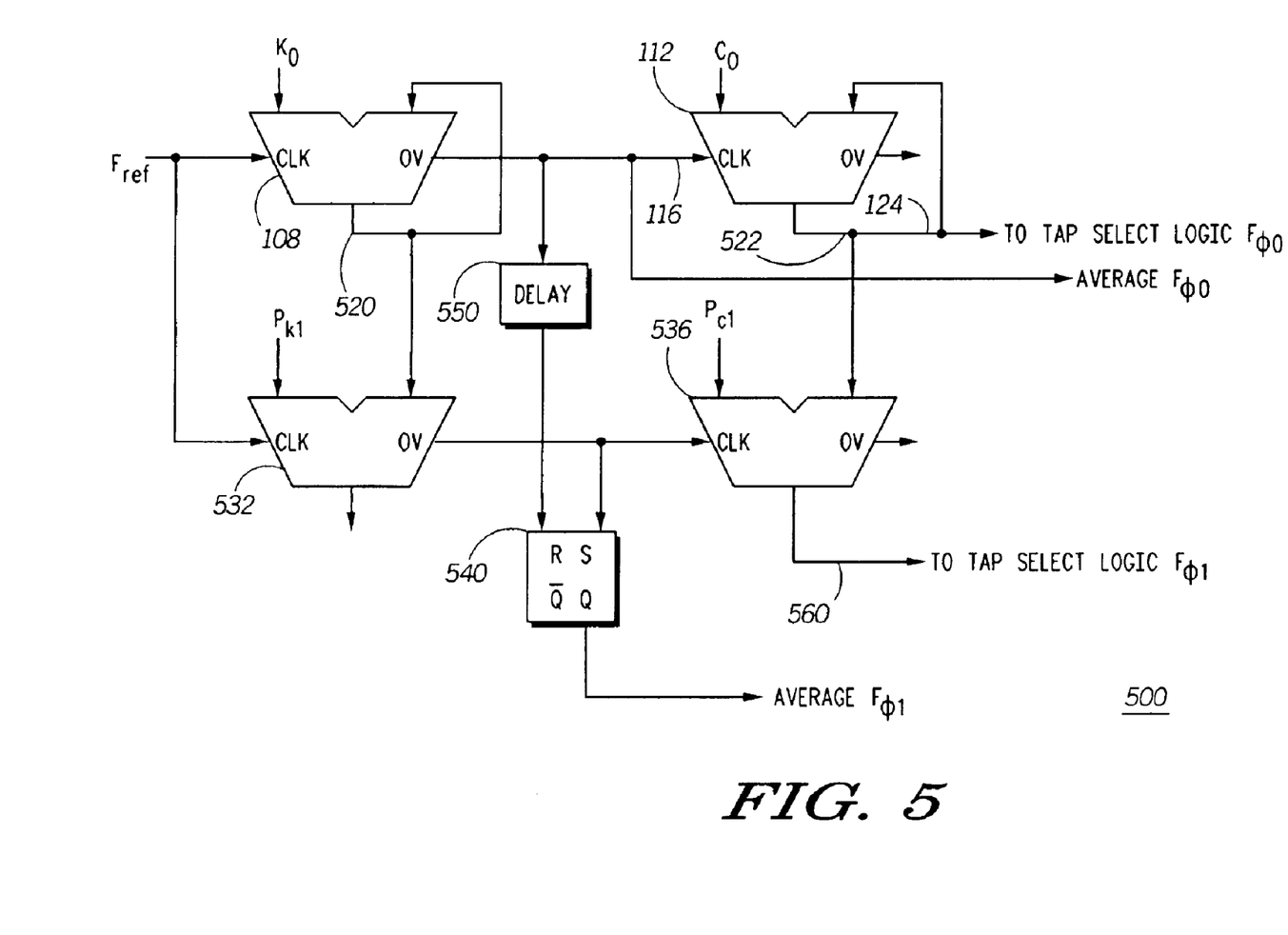
FIG. 5 is block diagram of another alternative programmable skew clock circuit consistent with certain embodiments of the present invention

In the above embodiments, certain accumulators are preloaded with preload values in order to establish the desired skewing of the output clock signals. With reference to FIG. 5, another embodiment 500 is presented in which the phase can be changed at any point in time, whereas the previous architectures use a preloading of the desired skew on startup (however, those skilled in the art will appreciate that by manipulation of the inputs, additional skews can be achieved dynamically in the prior architecture). In this alternative architecture, the second and subsequent outputs are no longer independent in frequency since they are directly tied to the first output.

In FIG. 5, much of the clock generation circuit (tap select, delay line etc) can be the same as in the circuits of FIG. 1 and FIG. 3. The top two accumulators, 108 and 112 function in the same manner as in the previous architectures and may be preloaded with values of zero or other preload value. The output of accumulator 112 drives tap select logic 126 as before. The overflow 116 of accumulator 108 represents an average value of $F_{\phi 0}$ as in the previous embodiments. Accumulators 532 and 536 now take the outputs 520 and 522 of accumulators 108 and 112 respectively and add in a phase offset term shown as $P_{K1}$ and $P_{C1}$ respectively. The output 560 can be used to drive the tap select logic (e.g., 140) to select delay line taps to produce output $F_{\phi 1}$. The phase relationship between $F_{\phi 0}$ and $F_{\phi 1}$ can thus be dynamically adjusted by selection of values $P_{K1}$ and $P_{C1}$. The result is that the phase offset may be added in at any time instead of just once at startup as described previously using the preload values.

In order to assure that a continuous overflow is not produced for large values of $P_{K1}$, a set-reset (S/R) flip-flop 546 can be provided so that an average value of $F_{\phi 1}$ is produced if desired. By imposing a small delay 550 between the line 116 and the reset input of the flip flop 546, a reset can be assured if a set and reset signal occur simultaneously. If the circuit of FIG. 5 drives fast edge triggered logic or if the values of $P_{K1}$ and $P_{C1}$ are constrained, delay 550 and flip flop 540 may not be needed. The architecture of FIG. 5, thus, provides a general solution where the two outputs shown are expected to be at the same frequency with a phase offset less that 2*Pi.

The following relationships govern the operation of the circuit of FIG. 5 and are similar to the prior equations:

$$\frac{K_0}{K_{MAX}} = \frac{F_{OUT}}{F_{ref}}, \quad \text{Eqn. 15}$$

$$C_0 = \text{Frac}\left(\frac{K_{MAX}}{K}\right) \cdot C_{MAX}, \quad \text{Eqn. 16}$$

$$P_{KI} = \frac{\phi_1}{2\pi} \cdot K_{MAX}, \quad \text{Eqn. 17}$$

$$P_{CI} = \left[\text{Frac}\left(\frac{K_{MAX} - P_{KI}}{K_0}\right)\right] C_{MAX}, \quad \text{Eqn. 18}$$

In this embodiment, it should be recognized that not only can the phase shift be skewed by use of constants $P_{K1}$ and $P_{C1}$, but in addition, the phase skew can be made time varying by making the values of $P_{K1}$ and $P_{C1}$ vary with time in any desired manner as follows:

$$P_{KI}(t) = \frac{\phi_1(t)}{2\pi} \cdot K_{MAX}, \quad \text{Eqn. 19}$$

$$P_{CI}(t) = \left[\text{Frac}\left(\frac{K_{MAX} - P_{KI}(t)}{K_0}\right)\right] C_{MAX}, \quad \text{Eqn. 20}$$

Thus, in accordance with certain embodiments consistent with the present invention, a programmable skew clock signal generator circuit has a reference frequency accumulator clocked by a reference frequency and receiving a constant $K_0$ as an input, the frequency accumulator having a maximum count $K_{MAX}$ and producing an output and an overflow output. A reference phase accumulator receives a phase offset constant $C_0$ as an input thereto, the phase accumulator having a maximum count $C_{MAX}$ and producing a phase accumulator output. A first adder is clocked by the reference frequency and adds the accumulator output with a value $P_{K1}$ to produce a first adder overflow output. A second adder is clocked by the first adder overflow output and adds the reference phase accumulator output with a value $P_{C1}$ to produce a second adder output. A delay line is clocked by the reference signal $F_{ref}$ and produces a plurality of delayed reference clock signals at a plurality of tap outputs. A tap selecting circuit receives the reference phase accumulator output and selects at least one of the tap outputs in response thereto to produce an output $F_{\phi 0}$, and receives the second adder output and selects at least one of the tap outputs in response thereto to produce an output $F_{\phi 1}$; wherein a phase shift $\phi_1$ relative to $F_{\phi 0}$ is a function of $P_{K1}$ and $P_{C1}$.

Thus, certain embodiments consistent with the present invention can provide the ability to control the phase of the output signals. Compared to other de-skew approaches that seek to provide skew correction as a post processing function, the phase control (de-skewing) of certain embodiments of the present invention can now be achieved in the frequency generation function. In certain embodiments, this can provide better phase resolution, higher level of integration, and an ability to adjust the phase over a wider range of output frequencies.

Certain embodiments consistent with the present invention can find broad application for potential use in circuits needing synchronous operation among multiple functional circuit blocks. One exemplary application is computing hardware; from low-end personal computers to high-end workstations and even supercomputers that utilize parallel processing. Other potential uses will occur to those skilled in the art, upon consideration of the present teachings.

While the present invention has been disclosed using several exemplary embodiments in which three output signals are generated, the invention itself should not be considered similarly limited. Embodiments of the present invention can be extended by repeating the circuit configurations disclosed any number of times to create any number of output clock signals having any desired phase relationship. The resolution of the clock signals generated can be extended to any desired accuracy limited only by virtue of the input clock signal frequency, the number of delay line delay elements, and the control exercised on the variation of the delay of the individual delay elements of the delay lines. Also, although circuit 104 uses accumulator preload values of zero, this is not a requirement by any means. The output frequencies of the plurality of clock generator circuits can be selected to be the same value as that of circuit 104 or different as desired or required for the particular use at hand.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A programmable skew clock signal generator, comprising:
   a frequency generator circuit that produces an output signal $F_{\phi 0}$ from a reference signal $F_{ref}$;
   a frequency accumulator, preloaded with a preload value $P_{K1}$ for a first reference signal cycle and receiving a frequency division constant $K_1$ as an input thereto for subsequent cycles of $F_{ref}$, the frequency accumulator having a maximum count $K_{MAX}$ and producing an overflow output;
   a phase accumulator, receiving the overflow output from the frequency accumulator as a clock signal, preloaded with a preload value $P_{C1}$ for a first cycle of the overflow output from the frequency accumulator and receiving a phase offset constant $C_1$ as an input thereto during subsequent cycles of the overflow output from the frequency accumulator, the phase accumulator having a maximum count $C_{MAX}$ and producing a phase accumulator output;
   a delay line clocked by the reference signal $F_{ref}$ and producing a plurality of delayed reference clock signals at a plurality of tap outputs;
   tap selecting means receiving the phase accumulator output and selecting at least one of the tap outputs in response thereto to produce an output $F_{\phi 1}$ whose phase shift $\phi_1$ relative to $F_{\phi 0}$ is a function of $P_{K1}$ and $P_{C1}$; and
   wherein the output $F_{\phi 1}$ is given by:

$$x(t) = \mathrm{rect}\left(\frac{t}{T_p}\right) = \begin{cases} 1 & \text{for } |t| < \frac{T_p}{2} \\ 0 & \text{otherwise} \end{cases}$$

$$F_{\phi 1} = \sum_{n=0}^{\infty} x[t - nT_{\phi 1} - \phi],$$

where t is a time corresponding to a center of an output pulse, $T_p$ is the width of the output pulse, and $T_{\phi 1}$ is the period of the pulse train, and wherein $P_{K1}$ and $P_{C1}$ are respectively given by:

$$P_{K1} = \frac{\phi}{2\pi} \cdot K_{MAX} \text{ and } P_{C1} = \left[K_{MAX} - \mathrm{Frac}\left(\frac{P_{K1}}{K}\right)\right] \cdot C_{MAX}.$$

2. The programmable skew clock signal generator in accordance with claim 1, wherein the tap selecting means comprises:
   a tap selection logic circuit receiving the phase accumulator output and producing an address output; and
   a multiplexer circuit receiving the address output and selecting at least one of the delay line taps as output $F_{\phi 1}$.

3. The programmable skew clock signal generator in accordance with claim 2, wherein the multiplexer circuit comprises an array of transmission gate switches that are addressed by the address output.

4. The programmable skew clock signal generator in accordance with claim 3, wherein the array of transmission gate switches are integrated into the delay line circuit.

5. The programmable skew clock signal generator in accordance with claim 1, wherein the delay line is locked in a delay locked loop.

6. The programmable skew clock signal generator in accordance with claim 1, wherein the frequency generator circuit comprises:
   a reference frequency accumulator, preloaded with a preload value $P_{K0}=0$ for a first reference signal cycle and receiving a constant $K_0$ as an input during subsequent reference signal cycles, the frequency accumulator having a maximum count $K_{MAX}$ and producing an overflow output;
   a reference phase accumulator, preloaded with a preload value $P_{C0}=0$ for a first overflow output from the frequency accumulator as a clock signal, and receiving a phase offset constant $C_0$ as an input thereto during subsequent frequency accumulator overflow cycles, the phase accumulator having a maximum count $C_{MAX}$ and producing a phase accumulator output;
   a reference delay line clocked by the reference input signal and producing a plurality of delayed reference clock signals at a plurality of tap outputs; and
   reference tap selecting means receiving the phase accumulator output and selecting at least one of the tap outputs in response thereto to produce an output $F_{\phi 0}$.

7. A programmable skew clock signal generator, comprising:
   a frequency generator circuit that produces an output signal $F_{\phi 0}$ from a reference signal $F_{ref}$;
   a frequency accumulator, preloaded with a preload value $P_{K1}$ for a first reference signal cycle and receiving a frequency division constant $K_1$ as an input thereto for subsequent cycles of $F_{ref}$, the frequency accumulator having a maximum count $K_{MAX}$ and producing an overflow output;
   a phase accumulator, receiving the overflow output from the frequency accumulator as a clock signal, preloaded with a preload value $P_{C1}$ for a first cycle of the overflow output from the frequency accumulator and receiving a phase offset constant $C_1$ as an input thereto during subsequent cycles of the overflow output from the frequency accumulator, the phase accumulator having a maximum count $C_{MAX}$ and producing a phase accumulator output;
   a delay line clocked by the reference signal $F_{ref}$ and producing a plurality or delayed reference clock signals at a plurality of tap outputs;
   tap selecting means receiving the phase accumulator output and selecting at least one of the tap outputs in response thereto to produce an output $F_{\phi 0}$ whose phase shift $\phi_1$ relative to $F_{\phi 0}$ is a function of $P_{K1}$ and $P_{C1}$; and
   wherein the output $F_{\phi 1}$ is determined by:

$$F_{\phi 1} = F_{ref} \div \left[\mathrm{Integer}\left(\frac{K_{MAX}}{K_1}\right) + \mathrm{fract}\left(\frac{C_1}{C_{MAX}}\right)\right] = F_{ref} \cdot \frac{K_1}{K_{MAX}}.$$

8. The programmable skew clock signal generator in accordance with claim 6, wherein the frequency of $F_{\phi 0}$ is equal to the frequency of $F_{\phi 1}$.

9. A programmable skew clock signal generator, comprising:
   a frequency generator circuit that produces an output signal $F_{\phi 0}$ from a reference signal $F_{ref}$;
   first and second frequency accumulators, preloaded with a preload values $P_{K1}$ and $P_{K2}$ for a first cycle of the reference signal and receiving constants $K_1$ and $K_2$ as inputs thereto for subsequent cycles of the reference signal respectively, and producing first and second overflow outputs, the first and second frequency accumulators having a maximum count $K_{MAX1}$ and $K_{MAX2}$;

first and second phase accumulators, preloaded with preload values $P_{C1}$ and $P_{C2}$ respectively during an initial output from first and second overflow outputs respectively from the first and second frequency accumulators as clock signals, and receiving first and second phase offset constants $C_1$ and $C_2$ respectively as inputs thereto during subsequent accumulator overflow cycles, and producing first and second phase accumulator outputs, the first and second phase accumulators having a maximum count $C_{MAX2}$ and $C_{MAX2}$;

a delay line clocked by the reference input signal and producing a plurality of delayed reference clock signals at a plurality of tap outputs; and first and second tap selecting circuits, receiving the first and second phase accumulator outputs respectively, the first and second tap selecting circuits each selecting at least one of the tap outputs in response to the first and second phase accumulator outputs to produce first and second outputs $F_{\phi1}$ and $F_{\phi2}$, where phase shift $\phi_1$ relative to $F_{\phi0}$ is a function of $P_{K1}$ and $P_{C1}$ and phase shift $\phi_2$ relative to $F_{\phi0}$ a function of $P_{K2}$ and $P_{C2}$.

10. The programmable skew clock signal generator in accordance with claim 9, wherein the delay line is locked in a delay locked loop.

11. The programmable skew clock signal generator in accordance with claim 9, wherein the output $F_{\phi1}$ is given by:

$$x(t) = \text{rect}\left(\frac{t}{T_p}\right) = \begin{cases} 1 & \text{for } |t| < \frac{T_p}{2} \\ 0 & \text{otherwise} \end{cases}$$

$$F_{\phi1} = \sum_{n=0}^{\infty} x[t - nT_{\phi1} - \phi],$$

where t is a time corresponding to a center of an output pulse, $T_p$ is the width of the output pulse, and $T_{\phi1}$ is the period of the pulse train, and wherein $P_{K1}$ and $P_{C1}$ are respectively given by $$P_{K1} = \frac{\phi_1}{2\pi} \cdot K_{MAX} \text{ and } P_{C1} = \left[K_{MAX} - \text{Frac}\left(\frac{P_{K1}}{K}\right)\right]C_{MAX};$$

and
wherein the output $F_{\phi2}$ is given by:

$$x(t) = \text{rect}\left(\frac{t}{T_p}\right) = \begin{cases} 1 & \text{for } |t| < \frac{T_p}{2} \\ 0 & \text{otherwise} \end{cases}$$

$$F_{\phi2} = \sum_{n=0}^{\infty} x[t - nT_{\phi2} - \phi],$$

where t is a time corresponding to a center of an output pulse, $T_p$ is the width of the output pulse, and $T_{\phi2}$ is the period of the pulse train, and wherein $P_{K2}$ and $P_{C2}$ are respectively given by $$P_{K2} = \frac{\phi_2}{2\pi} \cdot K_{MAX} \text{ and } P_{C2} = \left[K_{MAX} - \text{Frac}\left(\frac{P_{K2}}{K}\right)\right]C_{MAX}.$$

12. The programmable skew clock signal generator in accordance with claim 9, wherein the first tap selecting circuit comprises:

a first tap selection logic circuit receiving the first phase accumulator output and producing a first address output; and a first multiplexer circuit receiving the first address output and selecting at least one of the delay line taps as output $F_{\phi1}$; and wherein the second tap selecting circuit comprises:

a second tap selection logic circuit receiving the second phase accumulator output and producing a second address output; and a second multiplexer circuit receiving the second address output and selecting at least one of the delay line taps as output $F_{\phi2}$.

13. The programmable skew clock signal generator in accordance with claim 12, wherein the first and second multiplexer circuits comprise first and second arrays of transmission gate switches that are addressed by the first and second address outputs respectively.

14. The programmable skew clock signal generator in accordance with claim 13, wherein the first and second arrays of transmission gate switches are integrated into the delay line circuit.

15. The programmable skew clock signal generator in accordance with claim 9, wherein the output $F_{\phi1}$ is determined by:

$$F_{\phi1} = F_{ref} \div \left[\text{Integer}\left(\frac{K_{MAX}}{K_1}\right) + \text{frac}\left(\frac{C_1}{C_{MAX}}\right)\right] = F_{ref} \cdot \frac{K_1}{K_{MAX}}.$$

16. The programmable skew clock signal generator in accordance with claim 9, wherein the output $F_{\phi2}$ is determined by:

$$F_{\phi2} = F_{ref} \div \left[\text{Integer}\left(\frac{K_{MAX}}{K_2}\right) + \text{frac}\left(\frac{C_2}{C_{MAX}}\right)\right] = F_{ref} \cdot \frac{K_2}{K_{MAX}}.$$

17. The programmable skew clock signal generator in accordance with claim 9, wherein the frequency generator circuit comprises:

a reference frequency accumulator, preloaded with a preload value $P_{K0}$ for a first cycle of the input reference signal, and receiving a constant $K_0$ as an input during subsequent cycles of the input reference signal, the frequency accumulator having a maximum count $K_{MAX}$ and producing an overflow output;

a reference phase accumulator, preloaded with a preload value $P_{C0}$ and receiving an overflow output from the frequency accumulator as a clock signal, receiving a phase offset constant $C_0$ as an input thereto, the phase accumulator having a maximum count $C_{MAX}$ and producing a phase accumulator output;

a reference delay line clocked by the reference input signal and producing a plurality of delayed reference clock signals at a plurality of tap outputs; and reference tap selecting means receiving the phase accumulator output and selecting at least one of the tap outputs in response thereto to produce an output $F_{\phi0}$.

18. The programmable skew clock signal generator in accordance with claim 17, wherein the preload value $P_{K0}=0$ and preload value $P_{C0}=0$.

19. The programmable skew clock signal generator in accordance with claim 9, wherein the frequency of $F_{\phi0}$ is equal to the frequency of $F_{\phi1}$ and the frequency of $F_{\phi2}$.

20. A programmable skew clock signal generator, comprising:

a delay line clocked by a reference signal $F_{ref}$ and producing a plurality of delayed reference clock signals at a plurality of tap outputs, the delay line being locked in a delay locked loop;

a frequency generator circuit that produces an output signal $F_{\phi0}$ from the reference signal $F_{ref}$, the frequency generator circuit comprising:

a reference frequency accumulator, preloaded with a preload value $P_{K0}$ during a first reference signal cycle as a clock signal and receiving a constant $K_0$ as an input during subsequent reference signal cycles, the frequency accumulator having a maximum count $K_{MAX}$ and producing an overflow output, a reference phase accumulator, preloaded with a preload value $P_{C0}$ during a first accumulator overflow cycle from the frequency accumulator as a clock signal, and receiving a phase offset constant $C_0$ as an input thereto during subsequent frequency accumulator overflow cycles, the phase accumulator having a maximum count $C_{MAX}$ and producing a phase accumulator output, and reference tap selecting means receiving the phase accumulator output and selecting at least one of the tap outputs in response thereto to produce an output $F_{\phi 0}$;

first and second frequency accumulators, preloaded with a preload values $P_{K1}$ and $P_{K2}$ during a first reference input signal cycle as a clock signal, and subsequently receiving constants $K_1$ and $K_2$ as inputs thereto respectively, and producing first and second overflow outputs, the first and second frequency accumulators having a maximum count $K_{MAX1}$ and $K_{MAX2}$;

first and second phase accumulators, preloaded with preload values $P_{C1}$ and $P_{C2}$ respectively during an initial cycle of the first and second overflow outputs respectively from the first and second frequency accumulators as clock signals, and subsequently receiving first and second phase offset constants $C_1$ and $C_2$ respectively as inputs thereto, and producing first and second phase accumulator outputs, the first and second phase accumulators having a maximum count $C_{MAX2}$ and $C_{MAX2}$; and first and second tap selecting circuits, receiving the first and second phase accumulator outputs respectively, the first and second tap selecting circuits each selecting at least one of the tap outputs in response to the first and second phase accumulator outputs to produce first and second outputs $F_{\phi 1}$ and $F_{\phi 2}$, where phase shift $\phi_1$ relative to $F_{\phi 0}$ is a function of $P_{K1}$ and $P_{C1}$ and phase shift $\phi_2$ relative to $F_{\phi 0}$ is a function of $P_{K2}$ and $P_{C2}$, wherein, the output $F_{\phi 1}$ is given by:

$$x(t) = \text{rect}\left(\frac{t}{T_p}\right) = \begin{cases} 1 & \text{for } |t| < \frac{T_p}{2} \\ 0 & \text{otherwise} \end{cases}$$

$$F_{\phi 1} = \sum_{n=0}^{\infty} x[t - nT_{\phi 1} - \phi],$$

where t is a time corresponding to a center of an output pulse, $T_p$ is the width of the output pulse, and $T_{\phi 1}$ is the period of the pulse train, and wherein $P_{K1}$ and $P_{C1}$ are respectively given by $$P_{K1} = \frac{\phi_1}{2\pi} \cdot K_{MAX} \quad \text{and} \quad P_{C1} = \left[K_{MAX} - \text{Frac}\left(\frac{P_{K1}}{K}\right)\right]C_{MAX};$$

and
wherein the output $F_{\phi 2}$ is given by:

$$x(t) = \text{rect}\left(\frac{t}{T_p}\right) = \begin{cases} 1 & \text{for } |t| < \frac{T_p}{2} \\ 0 & \text{otherwise} \end{cases}$$

$$F_{\phi 2} = \sum_{n=0}^{\infty} x[t - nT_{\phi 2} - \phi],$$

where t is a time corresponding to a center of an output pulse, $T_p$ is the width of the output pulse, and $T_{\phi 2}$ is the period of the pulse train, and wherein $P_{K2}$ and $P_{C2}$ are respectively given by $$P_{K2} = \frac{\phi_2}{2\pi} \cdot K_{MAX} \quad \text{and} \quad P_{C2} = \left[K_{MAX} - \text{Frac}\left(\frac{P_{K2}}{K}\right)\right]C_{MAX}.$$

21. A programmable skew clock signal generator circuit, comprising:

a reference frequency accumulator clocked by a reference frequency and receiving a constant $K_0$ as an input, the frequency accumulator having a maximum count $K_{MAX}$ and producing an output and an overflow output;

a reference phase accumulator receiving a phase offset constant $C_0$ as an input thereto, the phase accumulator having a maximum count $C_{MAX}$ and producing a phase accumulator output;

a first adder clocked by the reference frequency that adds the accumulator output with a value $P_{K1}$ to produce a first adder overflow output;

a second adder clocked by the first adder overflow output that adds the reference phase accumulator output with a value $P_{C1}$ to produce a second adder output;

a delay line clocked by the reference signal $F_{ref}$ and producing a plurality of delayed reference clock signals at a plurality of tap outputs; and tap selecting means receiving the reference phase accumulator output and selecting at least one of the tap outputs in response thereto to produce an output $F_{\phi 0}$, and receiving the second adder output and selecting at least one of the tap outputs in response thereto to produce an output $F_{\phi 1}$; wherein a phase shift $\phi_1$ relative to $F_{\phi 0}$ is a function of $P_{K1}$ and $P_{C1}$.

22. The circuit according to claim 21, wherein the reference frequency accumulator is preloaded with a preload value $P_{K0}$ for a first reference signal cycle and receives $K_0$ as an input during subsequent reference signal cycles; and wherein the reference phase accumulator is preloaded with a preload value $P_{C0}$ for a first overflow output from the frequency accumulator as a clock signal, and receives a phase offset constant $C_0$ as an input thereto during subsequent frequency accumulator overflow cycles.

23. The circuit according to claim 22, wherein $P_{K1}$ and $P_{C1}$ are time varying.

24. The circuit according to claim 21, wherein $P_{K1}$ and $P_{C1}$ are given by:

$$P_{K1} = \frac{\phi_1}{2\pi} \cdot K_{MAX}, \text{and} \quad P_{C1} = \left[\text{Frac}\left(\frac{K_{MAX} - P_{K1}}{K_0}\right)\right]C_{MAX}.$$

25. The circuit according to claim 21, wherein $P_{K1}$ and $P_{C1}$ are given by:

$$P_{K1}(t) = \frac{\phi_1(t)}{2\pi} \cdot K_{MAX}, \text{and} \quad P_{C1}(t) = \left[\text{Frac}\left(\frac{K_{MAX} - P_{K1}(t)}{K_0}\right)\right]C_{MAX}.$$

* * * * *